United States Patent [19]
Tsumura

[11] Patent Number: 6,044,253
[45] Date of Patent: Mar. 28, 2000

[54] METHOD AND APPARATUS USING FIRST AND SECOND VARIABLE GAIN CONTROL CIRCUITS TO REDUCE CROSS MODULATION IN A RADIO RECEIVER

[75] Inventor: Soichi Tsumura, Tokyo, Japan

[73] Assignee: NEC Corporation, Japan

[21] Appl. No.: 08/933,631

[22] Filed: Sep. 19, 1997

[30] Foreign Application Priority Data

Sep. 19, 1996 [JP] Japan .................................. 8-247960

[51] Int. Cl.[7] .................................................. H04Q 7/20
[52] U.S. Cl. .................................. 455/234.1; 455/241.1; 455/245.1
[58] Field of Search ........................... 455/232.1, 234.1, 455/241.1, 245.1, 245.2, 246.1, 247.1, 67.3

[56] References Cited

U.S. PATENT DOCUMENTS

| | | | |
|---|---|---|---|
| 4,380,824 | 4/1983 | Inoue ....................................... | 455/143 |
| 5,448,774 | 9/1995 | Yokozaki et al. ........................ | 455/343 |
| 5,732,342 | 3/1998 | Roth et al. ............................... | 455/455 |
| 5,734,974 | 3/1998 | Callaway, Jr. et al. ............... | 455/234.1 |
| 5,758,271 | 5/1998 | Rich et al. ............................. | 455/234.1 |
| 5,809,408 | 9/1998 | Fujumoto et al. .................... | 455/434.2 |
| 5,867,777 | 2/1999 | Yamaji et al. ......................... | 455/234.1 |

FOREIGN PATENT DOCUMENTS

| | | |
|---|---|---|
| 60-191527 | 9/1985 | Japan . |
| 1-151809 | 6/1989 | Japan . |
| 1-108650 | 7/1989 | Japan . |
| 1-309418 | 12/1989 | Japan . |
| 2-170628 | 7/1990 | Japan . |
| 4-363943 | 12/1992 | Japan . |
| 5-219024 | 8/1993 | Japan . |
| 5-335857 | 12/1993 | Japan . |
| 7-212262 | 8/1995 | Japan . |
| 8-139705 | 5/1996 | Japan . |
| 8-181554 | 7/1996 | Japan . |

OTHER PUBLICATIONS

Japanese Office Action issued Mar. 16, 1999 in corresponding Japanese Application.
English translation of selected portions of Mar. 16, 1999 Japanese Office Action.

*Primary Examiner*—Edward F. Urban
*Assistant Examiner*—Tilahun Gesesse
*Attorney, Agent, or Firm*—Ostrolenk, Faber, Gerb & Soffen, LLP

[57] ABSTRACT

A radio apparatus includes a first variable-gain circuit, a second variable-gain circuit, and a demodulator, wherein a band-pass filter is provided between the first and second variable-gain circuits and the demodulator inputs an output of the second variable-gain circuit. An error occurrence probability is detected from an output of the demodulator and a signal level is detected from the output of the second variable-gain circuit. A received signal strength is estimated from the signal level of the output of the second variable-gain circuit using an aggregate gain from the first variable-gain circuit to the second variable-gain circuit, and then the respective first and second gains of the first and second variable-gain circuits are changed in opposite directions depending on the error occurrence probability and the estimated received signal strength.

14 Claims, 4 Drawing Sheets

METHOD AND APPARATUS USING FIRST AND SECOND VARIABLE GAIN CONTROL CIRCUITS TO REDUCE CROSS MODULATION IN A RADIO RECEIVER

BACKGROUND OF THE INVENTION

1. Field of the Invention

The present invention generally relates to automatic gain control (AGC) and, in particular to gain controller and gain control method for a radio receiver.

2. Description of the Related Art

Hereinafter, the meaning and interpretation of a term "gain" includes not only amplification but also attenuation. Therefore, a variable gain circuit means a variable-gain circuit and/or a variable attenuator.

There has been disclosed a radio receiver which is designed to suppress cross modulation due to undesired waves in Japanese Patent examined Publication No.5-335857. The conventional radio receiver is provided with a gain controller which controls the gain of a variable attenuator. The output of the variable attenuator is detected by a detector and the detected signal is demodulated by a demodulator.

The gain control is performed based on the signal level of a detected signal which is to be demodulated and the error detection of a demodulated signal. More specifically, when an error in frame synchronization is detected and the signal level is higher than a predetermined level, the gain controller decreases the gain of the variable attenuator to a low value. In other words, when the frame sync error is detected in the case of the sufficient input signal level, the gain controller decides that the cross modulation due to two or more undesired waves occurs. Therefore, by decreasing the gain of the variable attenuator, the cross modulation can be reduced. Contrarily, when the frame syc error is not detected or when the frame sync error is detected and the signal level is lower than the predetermined level, the gain controller keeps the gain of the variable attenuator to a high value.

Another radio receiver using a conventional AGC circuit has been disclosed in Japanese Patent examined Publication No. 7-212262. The radio receiver is provided with a pair of resonance circuits each connected to a saturable reactor. The respective resonance circuits have a higher resonance frequency and a lower resonance frequency than a desired frequency, which provides variable attenuation. In other words, such a circuit is a kind of variable-frequency notch filter. Therefore, undesired waves causing cross modulation can be selectively eliminated.

SUMMARY OF THE INVENTION

According to the conventional radio receiver using the gain controller to decrease or increase the gain of the variable attenuator, when the gain of the variable attenuator is decreased, the signal level of a desired wave is also reduced. Contrarily, when the gain of the variable attenuator is kept at a high level, there is a possibility that the input of the demodulator increase to a very high level. Therefore, it is necessary to provide the demodulator with a wide input dynamic range to ensure the correct functioning thereof.

Further, since the gain of the variable attenuator switches between two levels, it is impossible to select an optimum level for the attenuation depending on the respective levels of desired and undesired waves. In the case where the gain of the variable attenuator is decreased to the low level, the signal level of a desired wave is also reduced as described above, resulting in deteriorated receiving performance in the radio receiver due to thermal noise and noise factor of the entire circuits of radio receiver.

According to another radio receiver using a kind of variable-frequency notch filter, in the case where lots of undesired waves cause the cross modulation, a large number of variable-frequency notch filters are needed. Actually, it is impossible to provide a radio receiver with such a large number of filters.

An object of the present invention is to provide a gain controller and a gain control method which can reduce distortion caused by cross modulation with keeping an input signal level of a demodulator substantially constant in a radio receiver.

Another object of the present invention is to provide a gain controller and a gain control method which can reduce third-order distortion caused by cross modulation with reliability and can use a demodulator having a relatively narrow input dynamic range.

According to an aspect of the present invention, in a radio receiver comprising a first variable-gain circuit, a second variable-gain circuit, and a demodulator, wherein a band-pass filter is provided between the first and second variable-gain circuits and the demodulator inputs an output of the second variable-gain circuit, an error occurrence probability is detected from an output of the demodulator and a signal level is detected from the output of the second variable-gain circuit. Subsequently, a received signal strength is estimated from the signal level of the output of the second variable-gain circuit using an aggregate gain from the first variable-gain circuit to the second variable-gain circuit, and then a first gain of the first variable-gain circuit and a second gain of the second variable-gain circuit are changed in opposite directions depending on the error occurrence probability and an estimated received signal strength.

According to another aspect of the present invention, the estimated received signal strength is compared with a predetermined signal strength when the error occurrence probability is greater than a first predetermined value. After calculating a decibel difference between the estimated received signal strength and the predetermined signal strength, when the estimated received signal strength is greater than the predetermined signal strength, the first gain of the first variable-gain circuit is decreased by three times the decibel difference and the second gain of the second variable-gain circuit is increased by the decibel difference. And when the estimated received signal strength is not greater than the predetermined signal strength, the first gain of the first variable-gain circuit is increased by the decibel difference and the second gain of the second variable-gain circuit is decreased by the decibel difference.

DETAILED DESCRIPTION OF THE PREFERRED EMBODIMENTS

Figure 1:
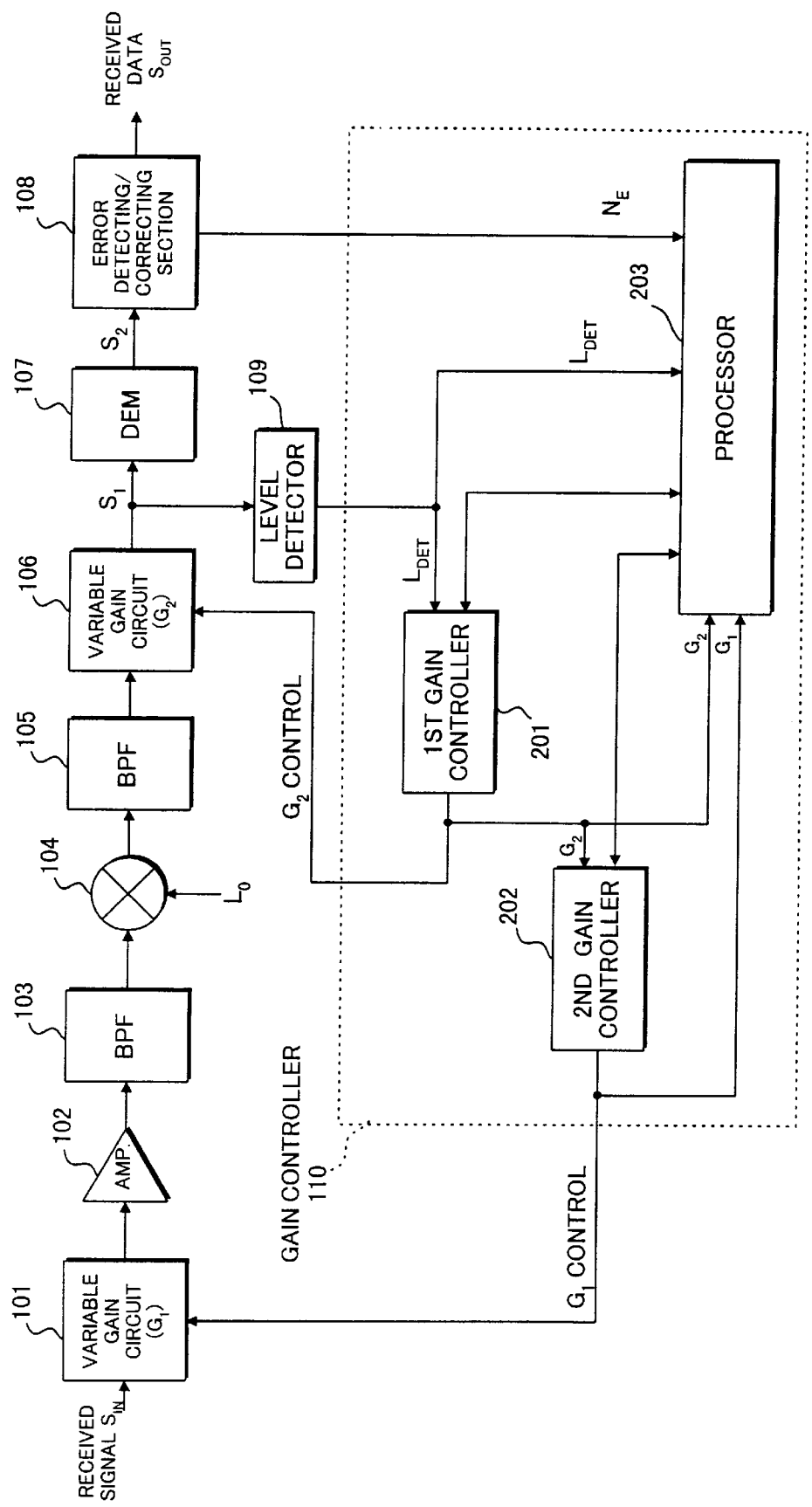
FIG. 1 is a block diagram showing an embodiment of a gain control circuit applied to a radio receiver according to the present invention.

Referring to FIG. 1, a radio receiver is provided with a first variable-gain circuit 101 which amplifies or attenuates a received radio-frequency (RF) signal $S_{IN}$ by a controlled gain $G_1$. The received RF signal is composed of frames each having a predetermined format. The output of the first variable-gain circuit 101 is amplified by an amplifier 102 having a fixed gain. The amplified RF signal passes through a band pass filter 103 and then is converted to an intermediate-frequency (IF) signal by a mixer 104 mixing the RF signal with a local oscillation signal Lo. The IF signal is of an intermediate frequency corresponding to the frequency difference between the RF signal and the local oscillation signal Lo. The IF signal passes through a band-pass filter 105 where components of undesired frequencies are removed from the IF signal.

A second variable-gain circuit 106 amplifies or attenuates the IF signal by a controlled gain $G_2$ to output an IF signal $S_1$ to a demodulator 107 which demodulates the IF signal $S_1$ into a demodulated signal $S_2$. When receiving the demodulated signal $S_2$ an error detecting/correcting section 108 produces received data $S_{OUT}$ and the number $N_E$ of detected errors in frames.

The IF signal $S_1$ which is an input signal of the demodulator 107 is also output to a level detector 109 which detects the signal level $L_{DET}$ thereof The signal level $L_{DET}$ may use one of an amplitude of the signal $S_1$, the square and the square root thereof. The signal level $L_{DET}$ is output to a gain controller 110 together with the detected signal level $L_{DET}$.

The gain controller 110, receiving the detected signal level $L_{DET}$ and the detected signal level $L_{DET}$, produces the $G_1$ control signal and the $G_2$ control signal which are output to the variable-gain circuit 101 and 106, respectively. The $G_2$ control signal is produced by a first gain controller 201 depending on the detected signal level $L_{DET}$, and the $G_1$ control signal is produced by a second gain controller 202 based on the magnitude of the $G_2$ control signal. When receiving the signal $S_1$ from the variable-gain circuit 106, the level detector 109 outputs the signal level $L_{DET}$ to the first gain controller 201 of the gain controller 110. The first gain controller 201 controls the gain $G_2$ of the variable-gain circuit 106 to keep an input level of the demodulator 107 at a predetermined level range. For example, when the signal level $L_{DET}$ of the signal $S_1$ exceeds the predetermined level range, the first controller 201 decreases the gain $G_2$ of the variable-gain circuit 106 by using the $G_2$ control signal. The second gain controller 202 controls the gain $G_1$ of the variable-gain circuit 101 so that the gain $G_2$ of the variable-gain circuit 106 does not reach its maximum or minimum value. More specifically, when the gain $G_2$ is about to reach the maximum or minimum gain of the variable-gain circuit 106, the second gain controller 202 increases or decreases the gain $G_1$ of the variable-gain circuit 101 so that the gain $G_2$ changes to a gain which is slightly smaller or larger than the maximum or minimum gain. In this manner, the input level of the demodulator 107 is kept at the predetermined level at all times. The details will be described later referring to FIG. 4.

The first and second gain controllers 201 and 202 are both controlled by a processor 203 which uses the current gains $G_1$ and $G_2$, the detected signal level $L_{DET}$, and the detected signal level $L_{DET}$ to perform the gain control according to the present invention. The processor 203 runs such a gain control program which is stored in a ROM (not shown). The details of the gain control will be described later referring to FIGS. 2 and 3.

More specifically, the variable-gain circuits 101 and 106 may be composed of a variable attenuator or a combination of a variable attenuator and a fixed-gain amplifier connected in series. Such a variable attenuator is preferably designed so that the maximum insertion loss is small. For example, a high-frequency variable resistor using a PIN diode may be used. Further, the variable attenuator may be formed with a plurality of resistor networks and a high-frequency switch which is used to select the resistor networks. Needless to say, the noise factor of the variable-gain amplifier or a fixed-gain amplifier used in the variable-gain circuit 101 or 106 is preferably as small as possible in the case of the same gain. For this purpose, especially, the input matching is adjusted to minimize the noise factor thereof at the frequency of a desired signal The fixed-gain amplifier 102 is composed of a bipolar transistor, a field-effect transistor or a combination thereof. Especially, the input matching is adjusted to minimize the noise factor thereof. The band-pass filter 103 may be formed with dielectric, ceramics or micro strip line and further a surface elastic wave may be used. The band-pass filter 103 has pass frequency bands which are all possible frequencies of desired waves. Preferably, the band-pass filter 103 filters out image frequency components which have effect on the mixer 104. The mixer 104 may be a balanced or unbalanced mixer comprising a transistor, a diode, a transform and the like. An image-cancel type mixer may be used as necessary.

The band-pass filter 105 has only a pass band which is the frequency band of a desired wave to be received and thereby attenuates other frequency components to the extent that deterioration due to cross modulation is negligible. Especially, it is preferable to sufficiently attenuate the leakage of the local oscillation signal. Such a sharp filtering characteristic is obtained by a filter using ceramics and surface elastic wave. The dielectric and micro strip line may be used.

First Embodiment of Gain Control

As described before, the error detecting/correcting section 108 corrects errors of the demodulated signal $S_2$ in frames to produce the output data $S_{OUT}$ and detects the number $N_E$ of the errors in frames. The signal level $L_{DET}$ of the signal $S_1$ is detected by the level detector 109, And current gains $G_1$ and $G_2$ to which the variable-gain circuits 101 and 106 are now set can be detected by monitoring the $G_1$ and $G_2$ control signals output from the second and first controllers 202 and 201.

Figure 2:
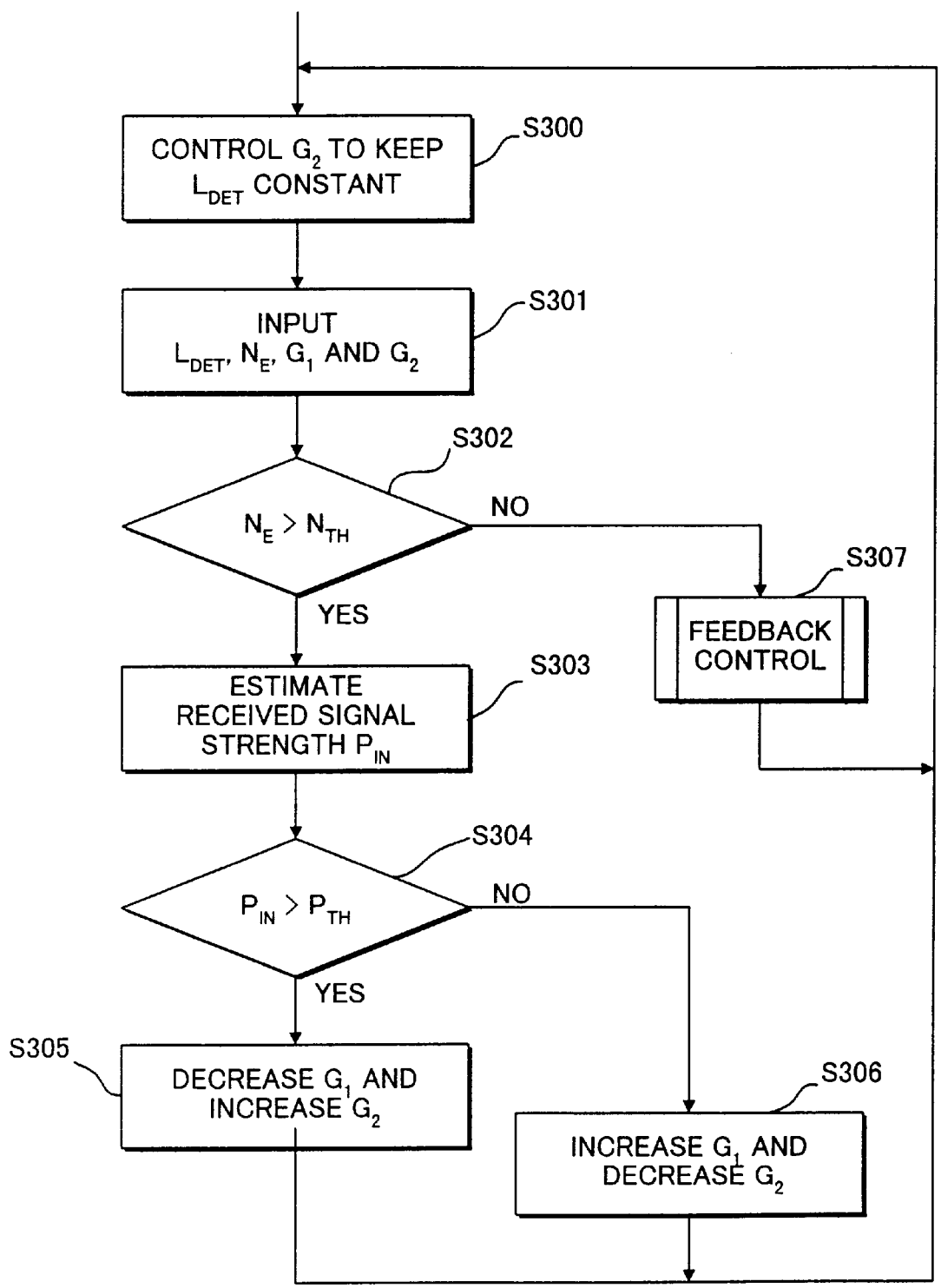
FIG. 2 is a flow chart showing a first embodiment of a gain control method according to the present invention.

Referring to FIG. 2, the signal level $L_{DET}$ is kept constant by controlling the $G_2$ control signal (step S300) and the processor 203 receives the signal level $L_{DET}$ from the level detector 109, the current $G_1$ and $G_2$ control signals from the second and first controllers 202 and 201, and the number $N_E$ of errors from the error detecting/correcting section 108 (step S301). First, the processor 203 compares the number $N_E$ of errors with a predetermined value $N_{TH}$ (step S302). When $N_E > N_{TH}$ (YES in step S302), the processor 203 estimates a received signal power strength $P_{IN}$ (step S303). The received signal power strength $P_{IN}$ can be estimated by using the current signal level $L_{DET}$ of the signal $S_1$, the current gains $G_1$ and $G_2$ of the variable-gain circuits 101 and 106, the fixed gain of the amplifier 102, and other gains of the band-pass filters 103 and 105 and the mixer 104.

If the estimated received signal power strength $P_{IN}$ is greater than a predetermined value $P_{TH}$ (YES in step S304), the processor 203 controls the first and second gain controllers 201 and 202 so that the gain $G_1$ of the variable-gain circuit 101 is decreased and the gain $G_2$ of the variable-gain circuit 106 is increased (step S305). On the other hand, if the estimated received signal power strength $P_{IN}$ is not greater than the predetermined value $P_{TH}$ (NO in step S304), the processor 203 controls the first and second gain controllers 201 and 202 so that the gain $G_1$ of the variable-gain circuit 101 is increased and the gain $G_2$ of the variable-gain circuit 106 is decreased (step S306). After the step S305 or S306, control goes back to the step S300.

Figure 4:
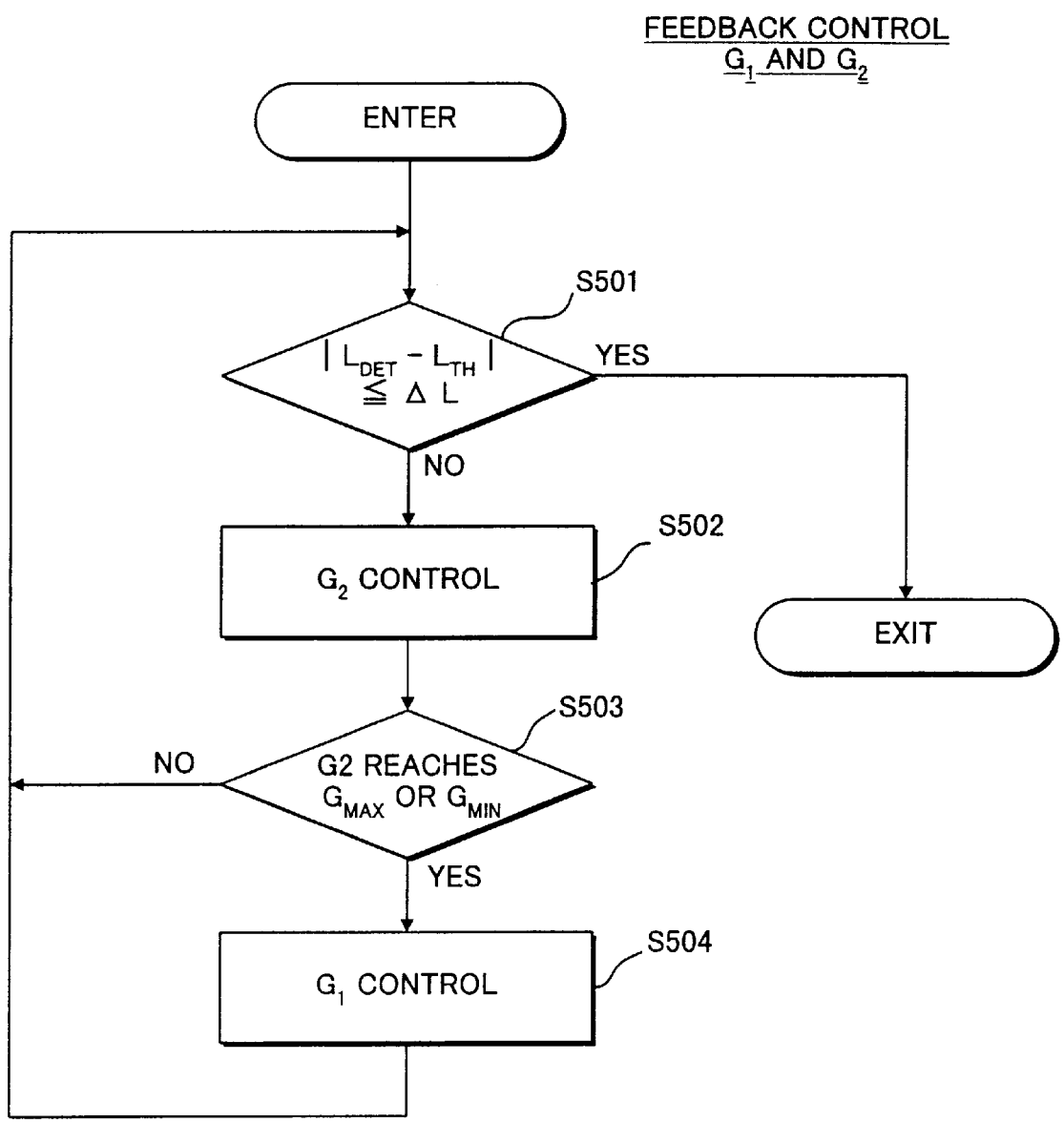
FIG. 4 is a flow chart showing a feedback gain control used in the first and second embodiments of FIGS. 2 and 3.

In the cases where $N_E$ is not greater than $N_{TH}$ (NO in step S302), the first and second gain controllers 201 and 202 perform a feedback control as shown in FIG. 4 (step S307).

As described above, in the cases where the number $N_E$ of errors is greater than the predetermined value $N_{TH}$ (YES in step S302) and the estimated received signal power strength $P_{IN}$ is greater than the predetermined value PT (YES in step S304), it is determined that cross modulation would occur due to large power undesired waves before the band-pass filter 105 to generate the errors in the demodulated signal $S_2$ although the received signal power is relatively large. In this case, the variable-gain circuit 101 decreases in gain and, at the same time, the variable-gain circuit 106 increases in gain (step S305). Therefore, the input level of the demodulator 107 can be kept at an approximate constant level. Further, the decreased gain $G_1$ causes the cross modulation due to undesired waves to be reduced and the increased gain $G_2$ causes the desired wave passing through the band-pass filter 105 to be amplified. Therefore, distortion due to the cross modulation can be effectively suppressed.

Contrarily, in the cases where the number $N_E$ of errors is greater than the predetermined value $N_{TH}$ (YES in step S302) and the estimated received signal power strength $P_{IN}$ is not greater than the predetermined value $P_{TH}$ (NO in step S304), it is determined that the errors occur in the demodulated signal $S_2$ because the current gain $G_1$ of the variable-gain circuit 101 is lower than necessary. In this case, the variable-gain circuit 101 increases in gain and, at the same time, the variable-gain circuit 106 decreases in gain (step S306).

Second Embodiment of Gain Control

Figure 3:
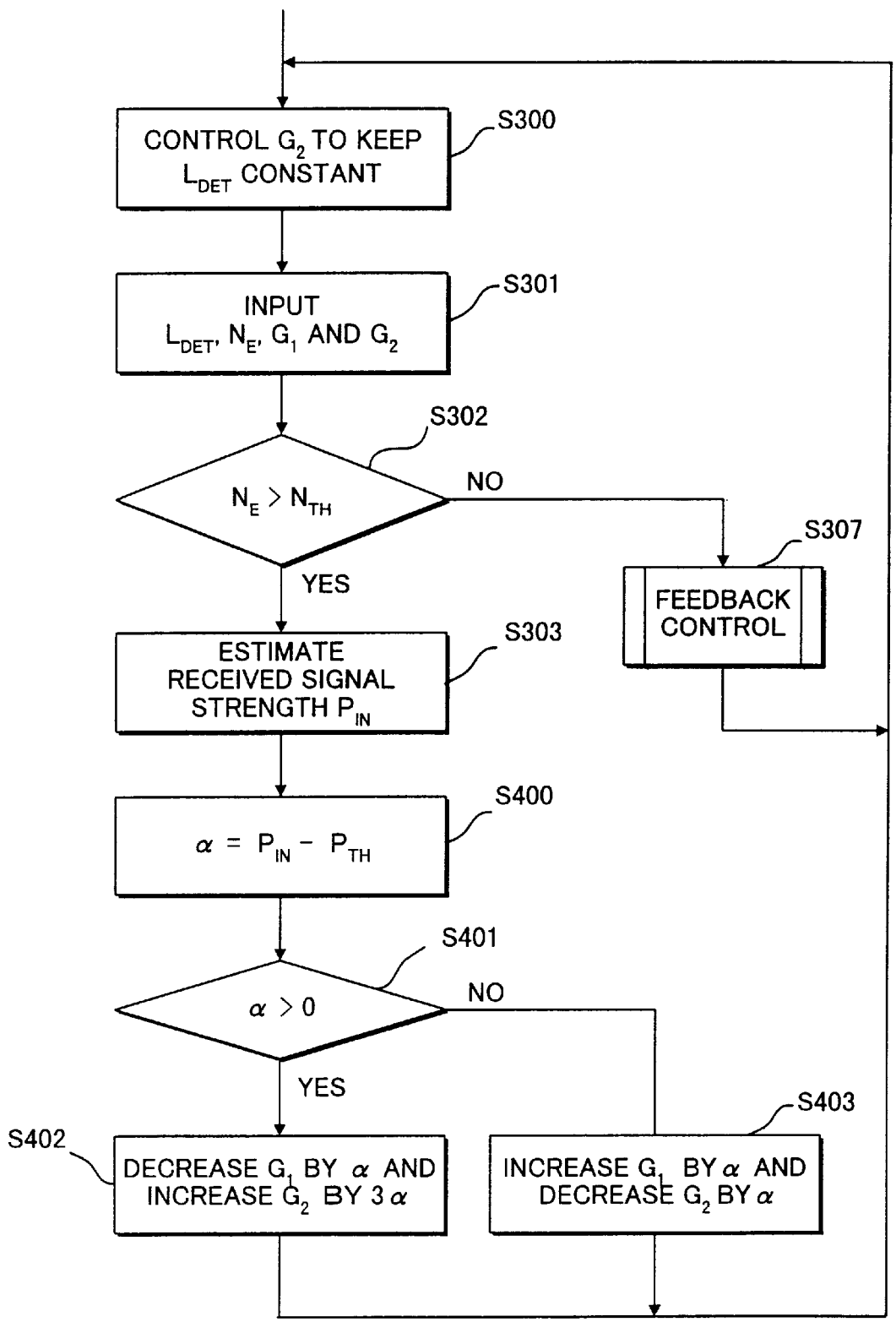
FIG. 3 is a flow chart showing a second embodiment of a gain control method according to the present invention.

Referring to FIG. 3, where steps similar to those previously described referring to FIG. 2 are denoted by the same reference numerals, the processor 203 calculates a power difference α (dB) by subtracting a predetermined value $P_{TH}$ from the estimated received signal power strength $P_{IN}$ (step S400) and checks whether the power difference α is positive (step S401). If it is positive (YES in step S401), the processor 203 controls the first and second gain controllers 201 and 202 so that the gain $G_1$ of the variable-gain circuit 101 is decreased by α (dB) and the gain $G_2$ of the variable-gain circuit 106 is increased by 3α (dB) (step S402). On the other hand, if the power difference α is not positive (NO in step S401), the processor 203 calculates a power difference α (dB) between them and controls the first and second gain controllers 201 and 202 so that the gain $G_1$ of the variable-gain circuit 101 is increased by α (dB) and the gain $G_2$ of the variable-gain circuit 106 is decreased by α (dB) (step S403). After the step S402 or S403, control goes back to the step S300.

In the cases where $N_E$ is not greater than $N_{TH}$ (NO in step S302), the first an second gain Controllers 201 and 202 perform a feedback control as shown in FIG. 4 (step S307).

As described above, in the cases where the number $N_E$ of errors is greater than the predetermined value $N_{TH}$ (YES in step S302) and the estimated received signal power strength $P_{IN}$ is greater than the predetermined value $P_{TH}$ (YES in step S304), it is determined that cross modulation would occur due to large power undesired waves before the band-pass filter 105 to generate the errors in the demodulated signal $S_2$ although the received signal power is relatively large. In this case, the variable-gain circuit 101 decreases in gain by the calculated power difference α (dB) and the variable-gain circuit 106 increases in gain by three times the calculated power difference, that is, 3α (dB). When decreasing the signal level by α (dB) before a circuit generating third-order distortion, the strength of undesired wave is decreased by 3α (dB). Therefore, the gain control of the step S402 can effectively eliminate the effect of the third-order distortion.

FEEDBACK CONTROL

Referring to FIG. 4, there is shown a feedback control step S307 as shown in FIGS. 2 and 3. When receiving the signal level $L_{DET}$ from the level detector 109, the first gain controller 201 decides on whether the level difference between the signal level $L_{DET}$ and a predetermined value $L_{TH}$ is smaller than a predetermined error ΔL (step S501). When the level difference is not smaller than ΔL (NO in step S501), the first gain controller 201 controls the gain $G_2$ of the variable-circuit 106 so that the signal level $L_{DET}$, that is, an input level of the demodulator 107 falls into an acceptable range of $L_{TH} \pm \Delta L$ (step S502).

The second gain controller 202 checks whether the gain $G_2$ of the variable-gain circuit 106 reaches the maximum $G_{MAX}$ or the minimum $G_{MIN}$ by monitoring the $G_2$ gain control signal at all times (step S503). When the gain $G_2$ of the variable-gain circuit 106 reaches the maximum $G_{MAX}$ or the minimum $G_{MIN}$ (YES in step S503), the second gain controller 202 increases or decreases the gain $G_1$ of the variable-gain circuit 101 so that the gain $G_2$ changes to a gain which is slightly smaller or larger than the maximum $G_{MAX}$ or the minimum $G_{MIN}$. In this manner, the input level of the demodulator 107 is kept at the predetermined level range at all times. Such a feedback control is performed as the step S307 in the first and second embodiments as shown in FIGS. 2 and 3.

In the above embodiments, the number $N_E$ of errors is used as the reciprocal of a probability of error-free signal receiving. Therefore, in the case where the Viterbi maximum-likelihood algorithm is used in the error detecting/correcting section 108, the reciprocal of a likelihood or an aggregate Hamming distance in the algorithm may be used instead of the number $N_E$ of errors. Similarly, the value calculated by the formula: 1– (normalized likelihood), may be used.

What is claimed is:

1. In a radio-receiver comprising a first variable-gain circuit, a second variable-gain circuit, and a demodulator, wherein a band-pass filter is provided between the first and second variable-gain circuits and the demodulator inputs an output of the second variable-gain circuit, a gain control method for the first and second variable-gain circuits, comprising the steps of:

a) detecting an error occurrence probability from an output of the demodulator;

b) detecting a signal level of the output of the second variable-gain circuit;

c) estimating a received signal strength from the signal level of the output of the second variable-gain circuit using an aggregate gain from the first variable-gain circuit to the second variable-gain circuit; and d) decreasing the first gain of the first variable-gain circuit and increasing the second gain of the second variable-gain circuit to keep the signal level within a predetermined range when the error occurrence probability is greater than a first predetermined value and an estimated received signal strength is greater than a second predetermined value; and increasing the first gain of the first variable-gain circuit and decreasing the second gain of the second variable-gain circuit to keep the signal level within the predetermined range when the error occurrence probability is greater than the first predetermined value and the estimated received signal strength is not greater than the second predetermined value.

2. The gain control method according to claim 1, further comprising the step of:

changing the second gain of the second variable-gain circuit so as to reduce a difference between the signal level and the predetermined range when the error occurrence probability is not greater than a first predetermined value.

3. The gain control method according to claim 2, further comprising the steps of:

monitoring the second gain the second variable-gain circuit; and changing the first gain of the first variable-gain circuit so as to cause the second gain to fall within a range between a maximum gain and a minimum gain of the second variable-gain circuit when the second gain reaches one of the maximum gain and the minimum gain.

4. The gain control method according to claim 1, wherein the step d) comprising the steps of:

comparing the estimated received signal strength with a predetermined signal strength when the error occurrence probability is greater than a first predetermined value;

calculating a decibel difference between the estimated received signal strength and the predetermined signal strength;

decreasing the first gain of the first variable-gain circuit by three times the decibel difference and increasing the second gain of the second variable-gain circuit by the decibel difference when the estimated received signal strength is greater than the predetermined signal strength; and increasing the first gain of the first variable-gain circuit by the decibel difference and decreasing the second gain of the second variable-gain circuit by the decibel difference when the estimated received signal strength is not greater than the predetermined signal strength.

5. The gain control method according to claim 4, further comprising the step of:

changing the second gain of the second variable-gain circuit so as to reduce a difference between the signal level and the predetermined range when the error occurrence probability is not greater than the first predetermined value.

6. The gain control method according to claim 1, further comprising the steps of:

monitoring the second gain the second variable-gain circuit; and changing the first gain of the first variable-gain circuit so as to cause the second gain to fall within a range between a maximum gain and a minimum gain of the second variable-gain circuit when the second gain reaches one of the maximum gain and the minimum gain.

7. In a radio receiver comprising a first variable-gain circuit, a second variable-gain circuit, and a demodulator, wherein a band-pass filter is provided between the first and second variable-gain circuits and the demodulator inputs an output of the second variable-gain circuit, a gain controller for the first and second variable-gain circuits, comprising:

an error detector for detecting an error occurrence probability from an output of the demodulator;

a level detector for detecting a signal level of the output of the second variable-gain circuit;

an estimator for estimating a received signal strength from the signal level of the output of the second variable-gain circuit using an aggregate gain from the first variable-gain circuit to the second variable-gain circuit; and a controller for decreasing the first gain of the first variable-gain circuit and increasing the second gain of the second variable-gain circuit to keep the signal level within a predetermined range when the error occurrence probability is greater than a first predetermined value and an estimated received signal strength is greater than a second predetermined value, and the controller increasing the first gain of the first variable-gain circuit and decreases the second gain of the second variable-gain circuit to keep the signal level within the predetermined range when the error occurrence probability is treater than the first predetermined value and the estimated received signal strength is not greater than the second predetermined value.

8. The gain controller according to claim 7, wherein the controller compares the estimated received signal strength with a predetermined signal strength when the error occurrence probability is greater than a first predetermined value, calculates a decibel difference between the estimated received signal strength and the predetermined signal strength, decreases the first gain of the first variable-gain circuit by three times the decibel difference and increasing the second gain of the second variable-gain circuit by the decibel difference when the estimated received signal strength is greater than the predetermined signal strength, and increases the first gain of the first variable-gain circuit by the decibel difference and decreasing the second gain of the second variable-gain circuit by the decibel difference when the estimated received signal strength is not greater than the predetermined signal strength.

9. The gain controller according to claim 7, further comprising:

a first feedback controller for changing the second gain of the second variable-gain circuit so as to reduce a difference between the signal level and the predetermined range when the error occurrence probability is not greater than the first predetermined value.

10. The gain controller according to claim 9, further comprising:

a second feedback controller for monitoring the second gain the second variable-gain circuit and changing the first gain of the first variable-gain circuit so as to cause the second gain to fall within a range between a maximum gain and a minimum gain of the second variable-gain circuit when the second gain reaches one of the maximum gain and the minimum gain.

11. A radio receiver comprising:

a first variable-gain circuit for receiving a received signal;

a frequency converter for converting a relatively high frequency of the received signal to a relatively low frequency;

a band-pass filter for filtering out frequency components other than a desired wave from an output of the frequency converter;

a second variable-gain circuit for receiving an output of the band-pass filter;

a demodulator for demodulating an output of the second variable-gain circuit to produce a demodulated signal;

an error detector for detecting an error occurrence probability from an output of the demodulator;

a level detector for detecting a signal level of the output of the second variable-gain circuit; and a gain controller for controlling a first gain of the first variable-gain circuit and a second gain of the second variable-gain circuit, the gain controller comprising:

an estimator for estimating a received signal strength from the signal level of the output of the second variable-gain circuit using an aggregate gain from the first variable-gain circuit to the second variable-gain circuit; and a controller for decreasing the first gain of the first variable-gain circuit and increases the second gain of the second variable-gain circuit to keep the signal level within a predetermined range when the error occurrence probability is greater than a first predetermined value and an estimated received signal strength is treater than a second predetermined value, and the controller increasing the first gain of the first variable-gain circuit and decreases the second gain of the second variable-gain circuit to keep the signal level within the predetermined range when the error occurrence probability is greater than the first predetermined value and the estimated received signal strength is not greater than the second predetermined value.

12. The radio receiver according to claim 11, wherein the controller compares the estimated received signal strength with a predetermined signal strength when the error occurrence probability is greater than a first predetermined value, calculates a decibel difference between the estimated received signal strength and the predetermined signal strength, decreases the first gain of the first variable-gain circuit by three times the decibel difference and increasing the second gain of the second variable-gain circuit by the decibel difference when the estimated received signal strength is greater than the predetermined signal strength, and increases the first gain of the first variable-gain circuit by the decibel difference and decreasing the second gain of the second variable-gain circuit by the decibel difference when the estimated received signal strength is not greater than the predetermined signal strength.

13. The radio receiver according to claim 11, wherein the gain controller further comprises:

a first feedback controller for changing the second gain of-the second variable-gain circuit so as to reduce a difference between the signal level and the predetermined range when the error occurrence probability is not greater than the first predetermined value.

14. The radio receiver according to claim 13, wherein the gain controller further comprises:

a second feedback controller for monitoring the second gain the second variable-gain circuit and changing the first gain of the first variable-gain circuit so as to cause the second gain to fall within a range between a maximum gain and a minimum gain of the second variable-gain circuit when the second gain reaches one of the maximum gain and the minimum gain.

* * * * *